United States Patent [19]

Henry et al.

[11] Patent Number: 4,665,609

[45] Date of Patent: May 19, 1987

[54] PROCESS OF MANUFACTURING A PHOTOSENSITIVE DEVICE HAVING A PLURALITY OF DETECTORS SEPARATED BY ZONES IMPERVIOUS TO THE RADIATION TO BE DETECTED

[75] Inventors: Yves Henry, Eybens; André Nicollet, Grenoble; Michel Villard, Vitry sur Seine; all of France

[73] Assignee: Thomson - CSF, Paris, France

[21] Appl. No.: 684,469

[22] Filed: Dec. 21, 1984

[30] Foreign Application Priority Data

Dec. 27, 1983 [FR] France ................................ 83 20842

[51] Int. Cl.$^4$ ........................................... H01L 27/14
[52] U.S. Cl. .................................... 29/572; 29/576 B; 29/580; 357/30; 148/1.5; 148/DIG. 118
[58] Field of Search ..................... 29/572, 576 B, 580; 357/30, 56; 148/1.5, DIG. 118

[56] References Cited

U.S. PATENT DOCUMENTS 3,577,175 5/1971 Gri et al. ............................ 317/237
4,355,456 10/1982 Harnagel et al. .

FOREIGN PATENT DOCUMENTS 0024970 of 0000 European Pat. Off. .

OTHER PUBLICATIONS

Ghandi, VLSI Fabrication Principles, Silicon and Gallium Arsenide, John Wiley & Sons, New York, 1983, pp. 421, 476 and 498.
Patents Abstracts of Japan, vol. 6, No. 151, (E-124)(1029), 11 aout 1982; and JP-A-57 73 970 (Suwa Seikosha K.K.) (08.05.1982) * en entier *.
IBM Technical Disclosure Bulletin, vol. 19, No. 11, Avril 1977, New York (US) J.D. Tompkins: "Solid-State Optical . . . ".

Primary Examiner—Brian E. Hearn
Assistant Examiner—John T. Callahan
Attorney, Agent, or Firm—Roland Plottel

[57] ABSTRACT

The surface of a substrate which includes a plurality of photovoltaic junctions spaced along it is prepared as follows: a first anodic oxide layer is formed to cover the whole surface of the substrate and ensures perfect control of the photovoltaic junctions, a second layer is deposited of metal which is impervious to the radiation to be detected, then through photolithography, only the zones of the second layer that it is desired to render impervious to the radiation to be detected are maintained and the remainder removed; and finally, a layer of dielectric material is deposited to cover the whole surface.

13 Claims, 10 Drawing Figures

FIG_1-a
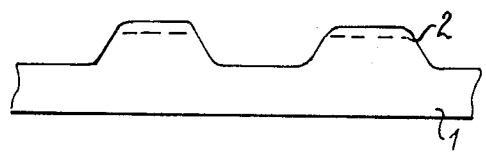
FIG_2-a
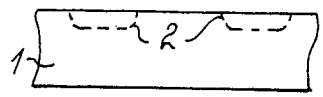
FIG_1-b
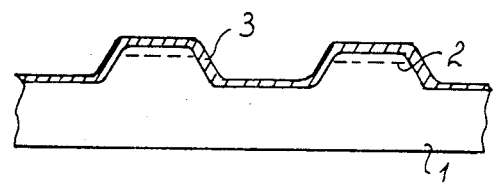
FIG_2-b
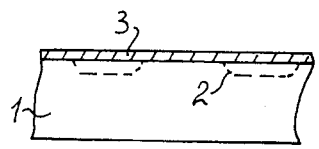
FIG_1-c
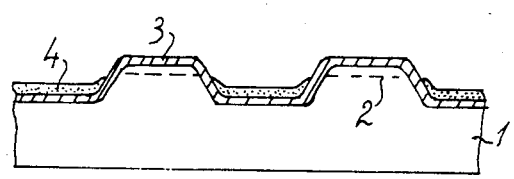
FIG_2-c
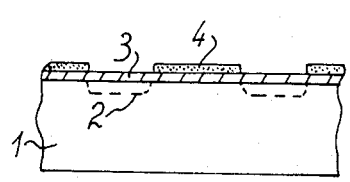
FIG_1-d
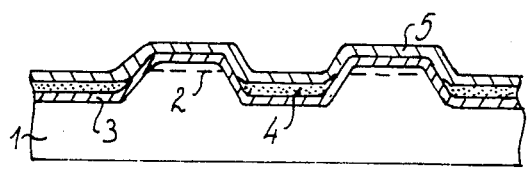
FIG_2-d
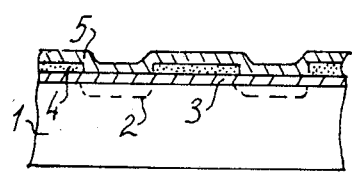
FIG_1-e
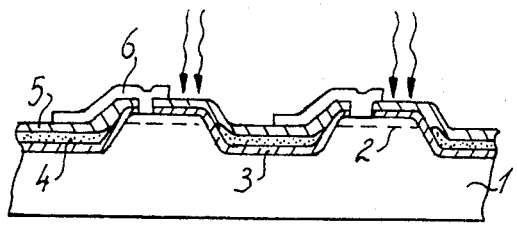
FIG_2-e
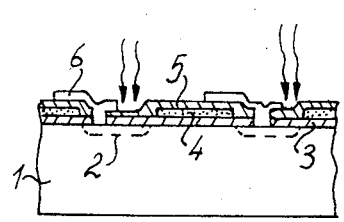

PROCESS OF MANUFACTURING A PHOTOSENSITIVE DEVICE HAVING A PLURALITY OF DETECTORS SEPARATED BY ZONES IMPERVIOUS TO THE RADIATION TO BE DETECTED

FIELD OF THE INVENTION

The present invention related to a process for making a photosensitive device having a plurality of detectors separated by zones which are impervious to the radiation to be detected.

DESCRIPTION OF THE PRIOR ART

Known detectors of this type are generally photodiodes or photo-MOS integrated on a single semi-conductor substrate.

French patent application No. 79 21903 filed Aug. 31, 1979 in the name of THOMSON-CSF and published under No. 2 464 563 disclosed that in certain applications it is required to reduce the dimensions of the detectors. In certain cases an "edge effect" is observed, i.e. the zone on which the radiation received by a detector produces its effects becomes substantially larger than the surface of the detector, thereby limiting the minimal dimension that can be effectively devoted to each detector.

This "edge effect" can be observed especially in semi-conductor substrates that are sensitive to infra-red radiation. This concerns either binary materials, such as indium antimonide, In Sb, lead telluride, Pb Te, ... or ternary materials such as mercury and cadmium telluride, Cd Hg Te or tin and lead telluride Pb Sn Te. Indeed, this "edge effect" is observed in a more general way when a high mobility semi-conductor substrate is used; for example, semi-conductors constituted of compounds from groups III and V, such as gallium aresenide, As Ga, or indium phosphride P In.

In order to overcome this "side effect", while maintaining detector dimensions small, various solutions have been proposed in the prior art in order to create between the detectors zones which are impervious to the radiation to be detected.

According to the prior art, photosensitive resin is utilized as a mask to create these impervious zones and is acting to delimit the zones reserved for the mesa photodiodes.

However, this solution has the following drawbacks:
the geometry of the zones coated with photosensitive resin necessarily determines the dimensions of the impervious zones and those of the detectors;
a thin layer, impervious to radiation is deposited, for example, by evaporation. This layer may be an insulating layer, but said deposit means that the insulator is electrically charged and that the photo-voltaic junctions of the detectors are not electrically stabilized to a maximum;
since the depositing of the layers impervious to the radiation is realized by auto-indexation on the zones coated with photosensitive resin, it is impossible to cover the edges of the junctions. The detectors therefore present an increased sensitivity on the edges of the junction, which is a drawback to operating.

Another solution according to the prior art consisted in using electrodes called "field electrodes".

In this case, junctions are made in the semi-conductor substrate which is coated with oxide. Through ports bored through the oxide, the electrodes are deposited in contact with the substrate. These electrodes are subjected to a potential and at the same time their geometry determines the geometry of the zones impervious to radiation separating the detectors.

The drawback of this solution is that there are risks of breakdown of the oxide, which is interposed between the semi-conductor substrate and the field electrode which are brought to different potentials.

SUMMARY OF THE INVENTION

The present invention relates to a manufacturing process of a photosensitive device, having between the detectors, zones that are impervious to radiation, which overcomes the drawbacks inherent to the solutions known in the prior art.

The present invention relates to a photosensitive device having a plurality of detectors integrated on a single semi-conductor substrate and, between the detectors, zones that are impervious to the radiation to be detected, and wherein the surface of the substrate is coated with three layers as follows:
a first anodic oxide layer that covers all the surface of the substrate;
a second layer, has at least one layer of a material that is impervious to the radiation to be detected, which covers only the desired to be radiation-impervious zones;
a third layer made of dielectric material covers all the surface.

The device according to the invention is not obtained through auto-indexation but allows one to vary easily the surface of the photosensitive detectors.

The use of a first anodic oxide layer covering all the semi-conductor substrate allows perfect stabilization of the photovoltaic junctions. This is due to the intrinsic qualities of the anodic oxides; in particular, it requires an oxide layer of thickness of about 100 to 600 Å, for example in order to obtain such results.

In the process according to the invention, it is possible to cover the edges of the junctions without any difficulty since the first insulating layer extends over the whole of the substrate and the second layer which is impervious to the radiation to be detected, is shaped by photolithography. This permits a liberal choice of the zones where it is desired to maintain this second layer.

In the process according to the invention, there are no risks of breakdown of the first insulating layer since the second layer does not receive any voltage and is covered by an insulating layer.

Furthermore, one advantage of the present invention is that the zones which are impervious to the radiation present an insulating surface that can be used without any short circuit risk for the passage of various connections.

In one example of use, the process according to the invention permits spacing two photodiodes to within 50 microns of each other with insignificant intermodulation problems, whereas in the prior art a spacing of at least 100 microns was necessary. These figures correspond to the example of a semi-conductor substrate made of N type indium antimonide, placed at 77 kelvin degrees, comprising $5.10^{15}$ majority charge carriers per cubic centimeter, for which the lifetime of the holes is about $2.10^{-7}$ seconds, the mobility is about 4000 $cm^2$ per volt/per second, which corresponds to a diffusion coefficient of about 26 $cm^2$ per second and a diffusion length Lp of about 23 microns. A decreasing level of the signal as a function of the distance x to the absorption point of a photon of form $I = I_0 \cdot e^{-x/L_p}$ is allowed. At a distance of 60 microns from the edge of a junction, the signal is still equal to $0.07 . I_0$; the device according to the invention thus allows the spacing of two photodiodes to within 50 microns of each other without any problem.

The same example for a P type indium antimonide substrate shows that at a distance of 60 microns from a junction edge, the signal is practically zero. In this case, the device according to the invention permits spacing the two photodiodes to within about 15 microns of each other.

The process according to the invention thus permits improved the resolution by bringing closer together the detectors, while limiting the optical coupling between the detectors.

BRIEF DESCRIPTION OF THE DRAWINGS

Other objects, features and results of the present invention will become apparent from the following description, given by way of nonlimitative example, and illustrated by appended FIGS. 1a to e and 2a to e which represent various stages of a manufacturing process of an embodiment of a device according to the invention, the case of a mesa structure in FIGS. 1a and e, and the case of planar structure in FIGS. 2a to e.

In all the drawings, the same references designate the same elements, but for enhanced clarity the dimensions and proportions of the various elements are not to scale.

DESCRIPTION OF THE PREFERRED EMBODIMENT

FIGS. 1a to e represent various steps of a manufacturing process according to the invention.

N/P or P/N type photovoltaic junctions 2, symbolically represented in FIG. 1a by dotted lines are formed on a semi-conductor substrate 1.

FIG. 1a represents mesa type diodes.

An oxide is made to grow through anodic oxidation over the whole surface of the substrate (cf. FIG. 1b). This first oxide layer bears the reference 3. Its thickness is about 100 to 600 Å. The growing of the anodic oxide occurs, for example, through electrolysis. In the case of a semi-conductor substrate of indium antimonide, it is possible, for example, to immerse the substrate in a potassium hydroxide solution of which it constitutes the anode, whereas as cathode, a platinum wire, for example, is used. The oxide obtained is rich in indium oxides. It should be noted that analysis of the obtained product reveals that the oxide deposit has been formed through anodic oxidation. In particular, the indium oxide deposited through evaporation is a conductor while the anodic indium oxide is a very good dielectric.

A second layer 4 impervious to the radiation to be detected is thereafter deposited on the first anodic oxide layer 3 (cf. FIG. 1c).

In the case of a visible radiation, this second layer is not necessarily metallic. A body such as arsenic pentaselenide $As_2 Se_5$ is impervious to visible radiation.

In the case of an infra-red radiation, the second must be metallic; it can, for example, be gold or aluminum.

Indeed, it has been observed that the deposit of a gold layer on the anodic oxide layer is not fully satisfactory since gold does not "adhere" very well on the oxide. It is possible to utilize as a second layer 4 one, constituted by the superimposing of at least first and second elementary metallic layers. The first elementary metallic layer is constituted by a metal ensuring a good contact, a good "adhesion", with the anodic oxide layer and with the second elementary metallic layer. For such first layer, it is possible to utilize a metal from the chromium, titanium, nickel or molybdenum groups, for example. These metals however are permeable to infra-red radiation, which justifies the utilization of a second elementary layer of gold, or aluminum, for example, if it is desired to detect infra-red radiation.

The second layer 4 impervious to radiation to be detected can be constituted by superimposing several elementary layers.

This second layer 4 is shaped by photolithography for example, in order to cover only the zones that it is desired to render impervious to the radiation to be detected.

FIG. 1c shows the result of this shaping.

The layer 4 can be allowed to remain only between the detectors. It is also possible to allow it to extend over a part of the detectors.

This second layer has a thickness of about 1000 to 6000 Å for example. It can be deposited for example through vacuum evaporation or cathodic sputtering.

On this second layer 4, a third layer 5 (cf. FIG. 1d) made of dielectric material is deposited, covering the whole surface. This can be an organic or inorganic insulator, for example, negative photosensitive resin or silicon monoxide, SiO.

This final layer can be deposited, for example, through vacuum evaporation, cathodic sputtering, ionic deposit, dipping coating, centrifugation, . . . .

Its thickness can be about 1 micron.

FIG. 1e shows that it is possible to make metallic connections 6 in contact with junctions 2 by ports penetrating the first and third layers. These connections 6 are placed on the third layer 5. It is possible also to use connections made of metal impervious to the radiation to be detected and thus to modify the geometry of the photosensitive zones.

FIGS. 2a to e differ from FIGS. 1a to e only in that they show planar structure diodes.

Accordingly, it is understood that the present invention is equally applicable to planar and mesa structures of the detectors.

We claim:

1. A process for manufacturing a device which comprises a plurality of detectors integrated on a common semiconductor substrate and separated by zones impervious to radiation to be detected which comprises the following steps in succession:
   (a) forming photosensitive junctions on the semiconductor substrate spaced apart along the substrate by regions free of such junctions;
   (b) growing an oxide over the surface of the substrate through anodic oxidation;
   (c) depositing over the substrate at least one layer which is impervious to the radiation to be detected;
   (d) etching said layer to remove it from surface portions overlying the photosensitive junctions so that it covers the regions free of junctions and defines thereby the zones which are to be impervious to the radiation to be detected;
   (e) depositing a layer of dielectric material over the whole surface;
   (f) forming openings in said layer of dielectric material to expose substrate surface portions overlying the photosensitive junctions; and
   (g) providing separate metallic connections to said exposed surface portions by way of said openings.

2. A process according to claim 1 in which the impervious layer is a metal and after being etched it remains electrically insulated from substrate by the oxide layer.

3. A process according to claim 2, wherein the layer which is impervious to the radiation to be determined is gold or aluminum.

4. A process according to claim 1, wherein during step (c) at least first and second elementary metal layers are deposited, the first elementary layer being of a metal ensuring a good contact, both with the anodic oxide and with the second elementary layer which is of a metal impervious to the radiation to be detected.

5. A process according to claim 4, wherein the metal ensuring a good contact is of the chromium, titanium, nickel or molybdenum groups.

6. A process according to claim 1, wherein the dielectric layer is made of negative photosensitive resin or silicon monoxide.

7. A process according to claim 1, wherein the semiconductor substrate is chosen in the following materials:
   infra-red sensitive material such as indium stibide, lead and tin telluride,
   compound of groups III and IV such as gallium arsenide and indium phosphoride.

8. A process according to claim 1, wherein the anodic oxide layer has a thickness of about 100 to 600 Å, the second layer has a thickness of about 1000 to 6000 Å and the third layer has a thickness of about 1 micron.

9. A process according to claim 1, wherein metallic connections are provided in contact with the substrate through a port formed through the oxide layer and the dielectric layer are placed on the dielectric layer and are impervious to the radiation to be detected.

10. A process according to claim 1, wherein the depositing of step (c) is carried out through vacuum evaporation of a metal.

11. A process according to claim 1, wherein during step (d), the metal layer is etched by photolithography.

12. A process according to claim 1, wherein the depositing of step (e) is carried out through vacuum evaporation, cathodic sputtering, ionic deposit, dipping coating or centrifugation.

13. A process according to claim 1, wherein the depositing of step (c) is carried out through cathodic sputtering.

* * * * *